(12) United States Patent
Komada et al.

(10) Patent No.: US 8,093,534 B2
(45) Date of Patent: Jan. 10, 2012

(54) COOKING DEVICE

(75) Inventors: Masamichi Komada, Hyogo (JP);
Hiroshi Tominaga, Hyogo (JP); Keiko Isoda, Hyogo (JP)

(73) Assignee: Panasonic Corporation, Osaka (JP)

( * ) Notice: Subject to any disclaimer, the term of this patent is extended or adjusted under 35 U.S.C. 154(b) by 248 days.

(21) Appl. No.: 12/666,078

(22) PCT Filed: Jun. 23, 2008

(86) PCT No.: PCT/JP2008/001622
§ 371 (c)(1),
(2), (4) Date: Dec. 22, 2009

(87) PCT Pub. No.: WO2009/001544
PCT Pub. Date: Dec. 31, 2008

(65) Prior Publication Data
US 2010/0187216 A1     Jul. 29, 2010

(30) Foreign Application Priority Data

Jun. 22, 2007     (JP) ................. 2007-164610

(51) Int. Cl.
H05B 3/66     (2006.01)
H05B 3/02     (2006.01)
H03K 17/94     (2006.01)
(52) U.S. Cl. ............. 219/443.1; 219/445.1; 219/507; 341/33
(58) Field of Classification Search .... 219/443.1–468.2, 219/483, 486, 489–511; 341/33, 34, 27
See application file for complete search history.

(56) References Cited

U.S. PATENT DOCUMENTS

| 4,105,902 A |   | 8/1978 | Iwai et al. |
| 5,155,338 A | * | 10/1992 | Hoffmann .................. 219/445.1 |
| 6,310,611 B1 | * | 10/2001 | Caldwell ....................... 345/173 |
| 7,022,949 B2 | * | 4/2006 | Shukla .......................... 219/483 |

FOREIGN PATENT DOCUMENTS

JP     52-067367     6/1977
(Continued)

OTHER PUBLICATIONS

An English translation of the International Preliminary Report on Patentability and Written Opinion of the International Searching Authority issued Jan. 12, 2010 in International Application PCT/JP2008/001622.

(Continued)

*Primary Examiner* — Sang Paik
(74) *Attorney, Agent, or Firm* — Wenderoth, Lind & Ponack, L.L.P.

(57) ABSTRACT

There is provided a cooking device capable of preventing heating operations from being unintentionally turned on and off and the setting of heating operations from being changed even when water droplets are scattered around touch switches or the vicinity of the touch switches is wiped with a damp cloth or the like. Left and right cancel electrodes (5a, 5b) are provided near the key electrodes between the positions of left and right heating coils (3a, 3b) and the positions of the key electrodes (4a1, 4a2, 4a3, 4b1, 4b2, 4b3). A control unit (6) changes over between validity and invalidity of inputting through the key electrodes based on whether or not a change of capacitances of the left and right cancel electrodes (5a, 5b) is equal to or more than a predetermined amount.

14 Claims, 9 Drawing Sheets

FOREIGN PATENT DOCUMENTS

| | | |
|---|---|---|
| JP | 58-010335 | 1/1983 |
| JP | 2003-279055 | 10/2003 |
| JP | 2003-303674 | 10/2003 |
| JP | 2005-300030 | 10/2005 |
| JP | 2006-207843 | 8/2006 |

OTHER PUBLICATIONS

International Search Report issued Sep. 9, 2008 in International (PCT) Application No. PCT/JP2008/001622.

* cited by examiner

(a) DETECTION OPERATION OF KEY ELECTRODE

(b) DETECTION OPERATION OF CANCEL ELECTRODE

COOKING DEVICE

TECHNICAL FIELD

The present invention relates to a cooking device having key electrodes provided in the same plane as that of a top plate and being capable of enabling operations through touch input.

BACKGROUND ART

A conventional cooking device includes a peripheral-condition detection section near an operation section, and prohibits inputting of the operation section to realize a non-heating state when an object is placed on the peripheral-condition detection section (refer to Patent document 1, for example).

Patent document 1: JP-A-2006-207843

DISCLOSURE OF INVENTION

Problems to be Solved by the Invention

However, with such a conventional structure, if a peripheral-condition detection section detects an object placed thereon, a non-heating state is always realized. For example, if water droplets and the like are scattered or cleaning is performed by wiping a portion around switches using a damp cloth, during heating, a heating operation is unintentionally turned off, which has induced a problem of poor usability.

The present invention has been made in order to overcome the problem in the related art and aims at providing a cooking device with excellent usability. More specifically, the present invention aims at providing a cooking device capable of preventing heating operations from unintentionally being turned on and off preventing the setting of heating operations from being changed, even when water droplets are scattered around the touch switches and the vicinity of the touch switches is wiped with a damp cloth or the like.

Means for Solving the Problems

In order to solve the above-described problems, a cooking device of the present invention includes: a main body serving as housing; a top plate provided on an upper surface of the main body; a heating coil operable to heat an object to be heated; capacitance-type touch switches, each of which includes a key electrode provided on a back surface of the top plate; and a control unit operable to detect capacitances formed between the key electrodes and a ground, the control unit determining that the key electrode is pushed to input a control command assigned to the pushed key electrode, when detecting, for a time equal to or more than a first predetermined time, that the capacitance of any of the key electrodes is increased by an amount equal to or more than a first predetermined amount based on a value set as a reference capacitance of the key electrodes; wherein the cooking device further has a cancel electrode located near the key electrodes and between a position at which the heating section is placed and a position at which the key electrodes are placed; the control unit detects a capacitance formed between the cancel electrode and the ground, when the control unit continuously detects, for a time equal to or more than a second predetermined time but less than a third predetermined time, that the capacitance of the cancel electrode is increased by an amount equal to or more than a second predetermined amount based on a value set as a reference capacitance of the cancel electrode, the control unit prohibits execution of a control command assigned to a key electrode even if determining that the key electrodes is pushed, and when the control unit continuously detects, for a time equal to or more than the third predetermined time, that the capacitance of the cancel electrode is increased by an amount equal to or more than the second predetermined amount from the reference capacitance of the cancel electrode, the control unit executes a control command assigned to a key electrode if determining that the key electrode is pushed.

Since the cancel electrode is provided near the key electrodes, it is possible to detect, with high accuracy, the peripheral condition around the key electrodes constituting the touch switches. More specifically, it is possible to easily distinguish activations caused by actual touch switch operations from activations caused by adhesion of water or cooked food around the touch switches or by wiping with a damp cloth or the like. This can prevent erroneous detections by the touch switches. Accordingly, it is possible to prevent the operation condition from being changed when a user does not intend to do so. This can improve the usability. Further, since the cancel electrode for detecting the peripheral condition is provided between the heating coil and the key electrodes and, therefore, even if the user performs a shaking operation and the like on a pan or the like, which is an object to be heated, and moves the pan to the touch switch portions, it is possible to prevent the occurrence of unintended operation transition. This further improves the usability.

Further, if the control unit continuously detects, for a time which is equal to or more than a second predetermined time but less than a third predetermined time, that the capacitance of the cancel electrode has increased by an amount equal to or more than a second predetermined amount from a reference capacitance of the cancel electrode, when the control unit determines that a key electrode has been pushed, the control unit prohibits execution of the control command assigned to this key electrode. Further, if the control unit continuously detects, for a time equal to or more than the third predetermined time, that the capacitance of the cancel electrode has increased by an amount equal to or more than the second predetermined amount from the reference capacitance of the cancel electrode, when the control unit determines that a key electrode has been pushed, the control unit executes the control command assigned to this key electrode. This enables easily distinguishing between operations due to touching around the key electrodes for relatively-shorter time periods such as wiping with a damp cloth or the like and intended placement of cooked food, seasoning and the like around the key electrodes by the user. During wipe, touch switch operations, that is, inputting through the key electrodes constituting the touch switches are made invalid, which can improve the usability. Even when cooked food, seasoning and the like are intentionally placed around the touch switch operation section, that is, the cancel electrode section, it is possible to enable key operations. As described above, it is possible to detect the usage environment with excellent accuracy, thereby improving the usability.

A cooking device includes: a main body serving as shell; a top plate provided on an upper surface of the main body; a heating coil operable to heat an object to be heated; capacitance-type touch switches, each of which includes a key electrode provided on a back surface of the top plate; and a control unit operable to detect capacitances formed between the key electrodes and a ground, the control unit determining that the key electrode is pushed to execute a control command assigned to the pushed key electrode, when detecting, for a time equal to or more than a first predetermined time, that the capacitance of any of the key electrodes is increased by an amount equal to or more than a first predetermined amount based on a value set as a reference capacitance of the key electrodes; wherein the cooking device further has a cancel electrode located near the key electrodes and between a position at which the heating section is placed and a position at which the key electrodes are placed; wherein the control unit detects a capacitance formed between the cancel electrode and the ground, when the control unit continuously detects, for a time equal to or more than a second predetermined time but less than a third predetermined time, that the capacitance of the cancel electrode is increased by an amount equal to or more than a second predetermined amount based on a reference capacitance of the cancel electrode, the control unit prohibits execution of a control command assigned to a key electrode even if determining that the key electrodes is pushed, and when the control unit continuously detects, for a time equal to or more than the third predetermined time, that the capacitance of the cancel electrode is increased by an amount equal to or more than the second predetermined amount based on the value set as the reference capacitance of the cancel electrode, the control unit replaces the reference capacitance of the cancel electrode with a value of the currently-detected capacitance of the cancel electrode.

Accordingly, it is possible to easily distinguish operations due to touching portions around the key electrodes for relatively-shorter time periods such as wiping with a damp cloth or the like and intended placement of cooked food, seasoning and the like around the key electrodes by the user. During wipe, touch switch operations, that is, inputting through the key electrodes, are made invalid, which can improve the usability. Even when cooked food, seasoning and the like are intentionally placed around the touch switch operation portion, that is, the cancel electrode portions, it is possible to perform key operations. As described above, it is possible to detect the usage environment with excellent accuracy, thereby improving the usability. Further, at a state where cooked food, seasoning or the like is placed, that is, if the cancel electrode is pushed for a time equal to or more than a predetermined time, the condition around the touch switches is detected again with the cancel electrode by setting, as a reference state, the state where the cooked food, seasoning or the like is placed. Therefore, even at a state where cooked food, seasoning or the like is placed, it is possible to easily determine whether or not it is an operation due to touching portions around the key electrodes for a relatively-shorter time period, such as wiping with a damp cloth, or the like. This improves the usability.

When the control unit continuously detects, for a time equal to or more than the second predetermined time but less than the third predetermined time, that the capacitance of the cancel electrode is increased by an amount equal to or more than the second predetermined amount based on the reference capacitance of the cancel electrode, the control unit may prohibit the execution of at least a control command for turning off a heating operation even if determining that the key electrode assigned to the control command for turning off a heating operation is pushed. During heating, particularly, water droplets and cooked food can be scattered with higher frequency. However, even if such adhered objects adhere to portions around the touch switches, the operation condition is not changed, which improves the usability. Further, even though the switches are touch-type, it is possible to perform wipe such as cleaning of portions around the touch switches, while maintaining the cooking condition. In particular, in the cases of devices having auto-cooking functions, such as auto rice cooking functions, unintended turn-off of heating during heating and the like induces disposal of cooked food. Accordingly, it is significantly effective to suppress erroneous heating turn-off operations, with the cancel electrode.

The cooking device may further include a power switch operable to change a state from a state in which no control command can be inputted through all of the key electrodes to a state in which a control command assigned to at least one of the key electrodes can be inputted by pushing the at least one key electrode, wherein the control unit may set the capacitances of the key electrodes and the cancel electrode at the time when the power switch is turned on, as initial values of reference capacitances of the key electrodes and the cancel electrode, respectively. When the power switch is operated, there is a lower possibility that the cancel electrode and the key electrodes are touched, which enables setting the reference capacitance values at a proper value.

The control unit may include a cancel-electrode voltage detection section for applying a high-frequency voltage having a predetermined voltage to the cancel electrode through a capacitor having a predetermined capacitance and detecting magnitude of the high-frequency voltage which is divided by the capacitance of the capacitor and the capacitance of the cancel electrode and is applied to the cancel electrode, and the control unit may detect the amount of increase in the capacitance of the cancel electrode, according to an amount of reduction of the voltage detected by the cancel-electrode voltage detection section based on a set cancel-electrode reference detection voltage. This enables employing only a single common signal line as a signal line for applying the high-frequency voltage to the cancel electrode and a signal line for determining the voltage of the cancel electrode, which can simplify the connection between the control unit and the cancel electrode. Further, it is also possible to employ the same structure for the key electrodes, which can simplify the entire structure.

The cancel-electrode voltage detection section may connect the key electrode to one end of the capacitor having a predetermined capacitance, apply a high-frequency voltage to the other end of the capacitor, rectify and convert the divided voltage of high-frequency voltage which is applied to the cancel electrode to a direct voltage, and output the direct voltage. This causes the output from the cancel-electrode voltage detection section to be a direct voltage, which enables the control unit to easily determine the detection voltages with higher accuracy, and also to alleviate the influence of external high-frequency noise. This also enables realization of capacitance-type touch keys with excellent stability. Further, it is also possible to employ the same structure for the key electrodes, which can simplify the entire structure.

The cooking device may further include an informing section, wherein, when the control unit prohibits the execution of the input commands from the key electrodes since the control unit continuously detects, for a time equal to or more than the second predetermined time but less than the third predetermined time, that the capacitance of the cancel electrode is increased by an amount equal to or more than the second predetermined amount based on the reference capacitance of the cancel electrode, the informing section generates a notification of this fact with a sound or light. This enables informing the user the condition around the touch switches, which offers the effect of encouraging the user to remove adhesion of water, objects placed around the touch switches and the like.

The key electrodes or the cancel electrode may be formed from a copper-foil conductor of a printed wiring board, and the printed wiring board may be placed beneath the top plate. This eliminates the necessity of a conductive member for electrically connecting printings on the top plate to the control unit, which can realize an inexpensive structure.

Effects of the Invention

In the cooking device according to the present invention, the cancel electrode is provided around the key electrodes constituting the touch switch sections, which enables determining whether the touch switches have been pushed due to maintenance, such as wipe-cleaning, or the touch switches have been intentionally operated by the user. The control unit changes over between validity and invalidity of inputting through the key electrodes, based on whether or not the change of the capacitance of the cancel electrode section is equal to or more than a predetermined amount. This enables invalidating key operations, if operations have not been intentionally performed. Further, key operations can be validated if a change of the capacitance of the cancel electrode which is equal to or more than the predetermined amount is continued for a relatively-longer time period. This enables key operations even when an object is unintentionally placed. Accordingly, the usability can be improved.

DESCRIPTION OF REFERENCE NUMERALS 1 main body
2 top plate
3$a$ left heating coil (heating section)
3$b$ right heating coil (heating section)
4$a$1 left down switch (key electrode)
4$b$1 right down switch (key electrode)
4$a$2 left up switch (key electrode)
4$b$2 right up switch (key electrode)
4$a$3 left heating on/off switch (key electrode)
4$b$3 right heating on/off switch (key electrode)
5$a$ left cancel electrode
5$b$ right cancel electrode
6 control unit
6$a$ connection terminal
6$b$ connection terminal
7$a$ left liquid crystal display unit (informing section)
7$b$ right liquid crystal display unit (informing section)
9$a$ key electrode connection portion
9$b$ cancel electrode connection portion
10 power switch
11 high-frequency power supply
12$a$-12$c$ key-electrode voltage detection section
12$d$ cancel-electrode voltage detection section

BEST MODE FOR CARRYING OUT THE INVENTION

Hereinafter, embodiments of the present invention will be described with reference to the drawings. Note that the present invention is not intended to be limited to these embodiments.

First Embodiment

Figure 1:
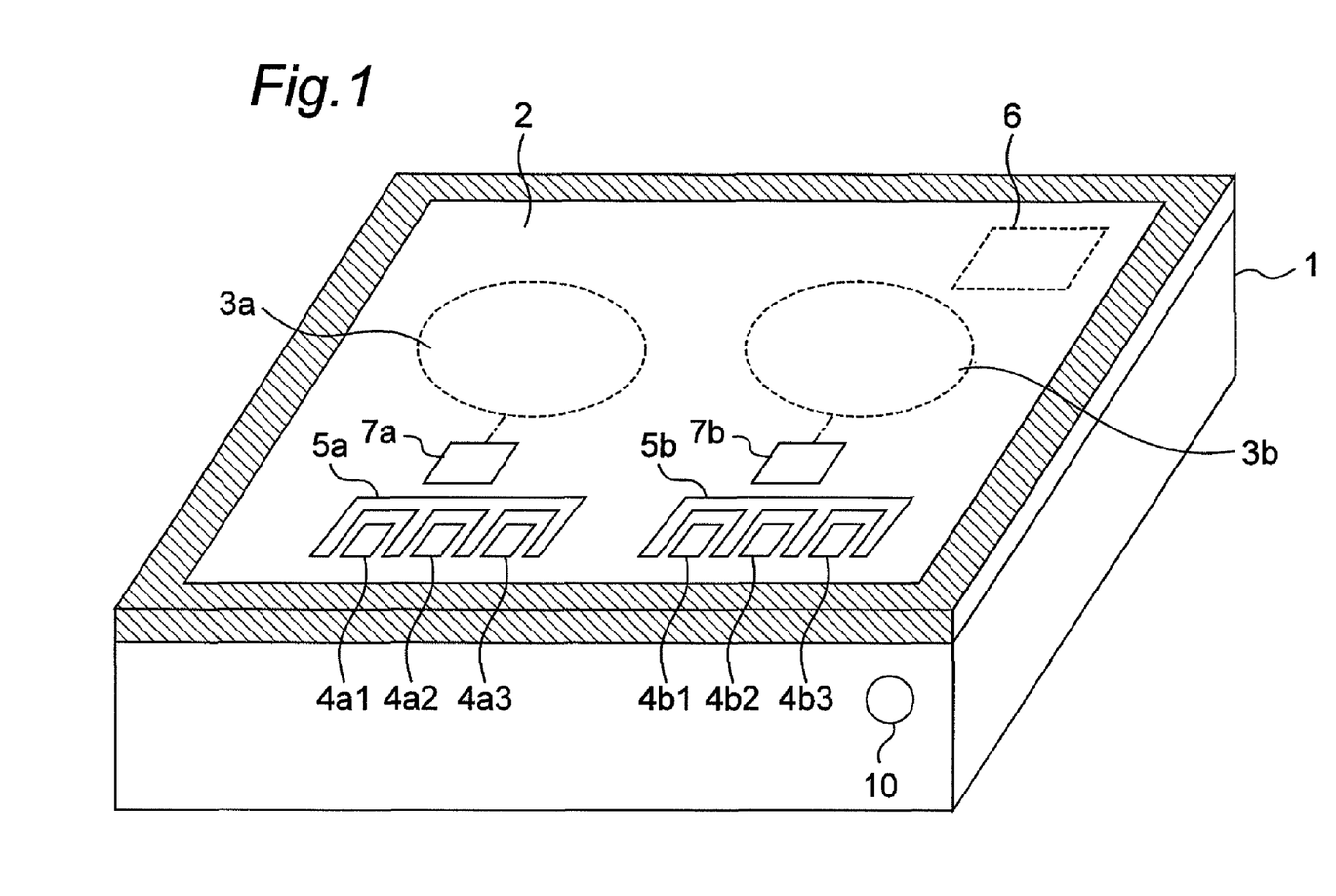
FIG. 1 is a diagram illustrating a structure of cooking devices according to first to fourth embodiments of the present invention.

FIG. 1 is a diagram of a structure of a cooking device according to the first embodiment of the present invention. A top plate 2 is provided on an upper surface of a main body 1 which forms an outer shape. In order to heat an object to be heated placed on the top plate 2, there are provided a left heating coil 3$a$ as a heating section under the top plate 2 in the left side of the main body, and a right heating coil 3$b$ as a heating section under the top plate 2 in the right side of the main body, at positions indicated by broken lines. The left heating coil 3$a$ and the right heating coil 3$b$ generate a magnetic field by flowing a high-frequency current to perform induction heating of the object to be heated over these heating coils.

On the back surface of the top plate 2, there are provided a key electrode 4$a$3 of a left heating on/off switch and a key electrode 4$b$3 of a right heating on/off switch, which are touch switches for controlling on/off of heating. Further, there are provided a key electrode 4$a$1 of a left down switch, a key electrode 4$a$2 of a left up switch, a key electrode 4$b$1 of a right down switch, and a key electrode 4$b$2 of a right up switch, which are touch switches for adjusting the heating output. In the rear of the respective touch switches, there are provided a left liquid crystal display unit 7$a$ and a right liquid crystal display unit 7$b$ which are informing sections which display the operation conditions and the setting conditions of the left and right heating sections, respectively.

On the back surface of the top plate 2, there is placed a left cancel electrode 5$a$ which is framed to have a band shape and also to have a comb shape in its entirety, near the key electrodes 4$a$1, 4$a$2 and 4$a$3 constituting a left group of touch switches, between the left heating coil 3$a$ and the key electrodes 4$a$1, 4$a$2 and 4$a$3 constituting the left group of touch switches, such that the left cancel electrode 5$a$ partitions the respective electrodes and areas therearound, except portions in a user's side with respect to the respective key electrodes, when viewed from above the top plate 2. Further, similarly, there is provided a right cancel electrode 5b which is formed to have a band shape and also to have a comb shape in its entirety, near the key electrodes 4b1, 4b2 and 4b3 constituting a right group of touch switches, between a position just above the right heating coil 3b and the key electrodes 4b1, 4b2 and 4b3 constituting the right group of touch switches, such that the right cancel electrode 5b partitions the respective electrodes and the areas therearound, except the portions in the user's side with respect to the respective key electrodes.

In this case, the key electrodes and the cancel electrodes which constitute the aforementioned respective touch switches are electrode portions constituting capacitance-type touch switches.

In the front side surface of the main body, there is placed a power switch 10 for turning on and off the main power supply of the device. Under the top plate 2, a control unit 6 is provided. Signals are inputted to the control unit 6 from the key electrode 4a3 constituting the left heating on/off switch, the key electrode 4a1 constituting the left down switch, the key electrode 4a2 constituting the left up switch, and the left cancel electrode 5a. The control unit 6 includes an inverter which supplies a high-frequency current to the left heating coil 3a, controls the heating output and outputs a signal to the left liquid crystal display unit 5a. Further, signals are inputted to the control unit 6 from the key electrode 4b3 constituting the right heating on/off switch, the electrode 4b1 constituting the right down switch, the key electrode 4b2 constituting the right up switch, and the right cancel electrode 5b. The control unit 6 includes an inverter which supplies a high-frequency current to the right heating coil 3b, controls the heating output and outputs a signal to the right liquid crystal display unit 5b. Further, the power switch 10 is not limited to one which turns on and off the main power supply of the device. The power switch 10 is required only to be a switch which can change a state from a state in which no control command can be inputted through all of the key electrodes to a state in which a control command assigned to at least one of the key electrodes can be inputted by pushing the at least one key electrode.

In the present embodiment, there are provided the heating coils, the heating on/off switches, the up switches, the down switches, the liquid crystal display units and the cancel electrodes, individually in the left and right sides. The aforementioned components perform the same operation in the left block and in the right block. Accordingly, the right block will not be described and, on behalf thereof, the left block will be described.

Figure 2A:
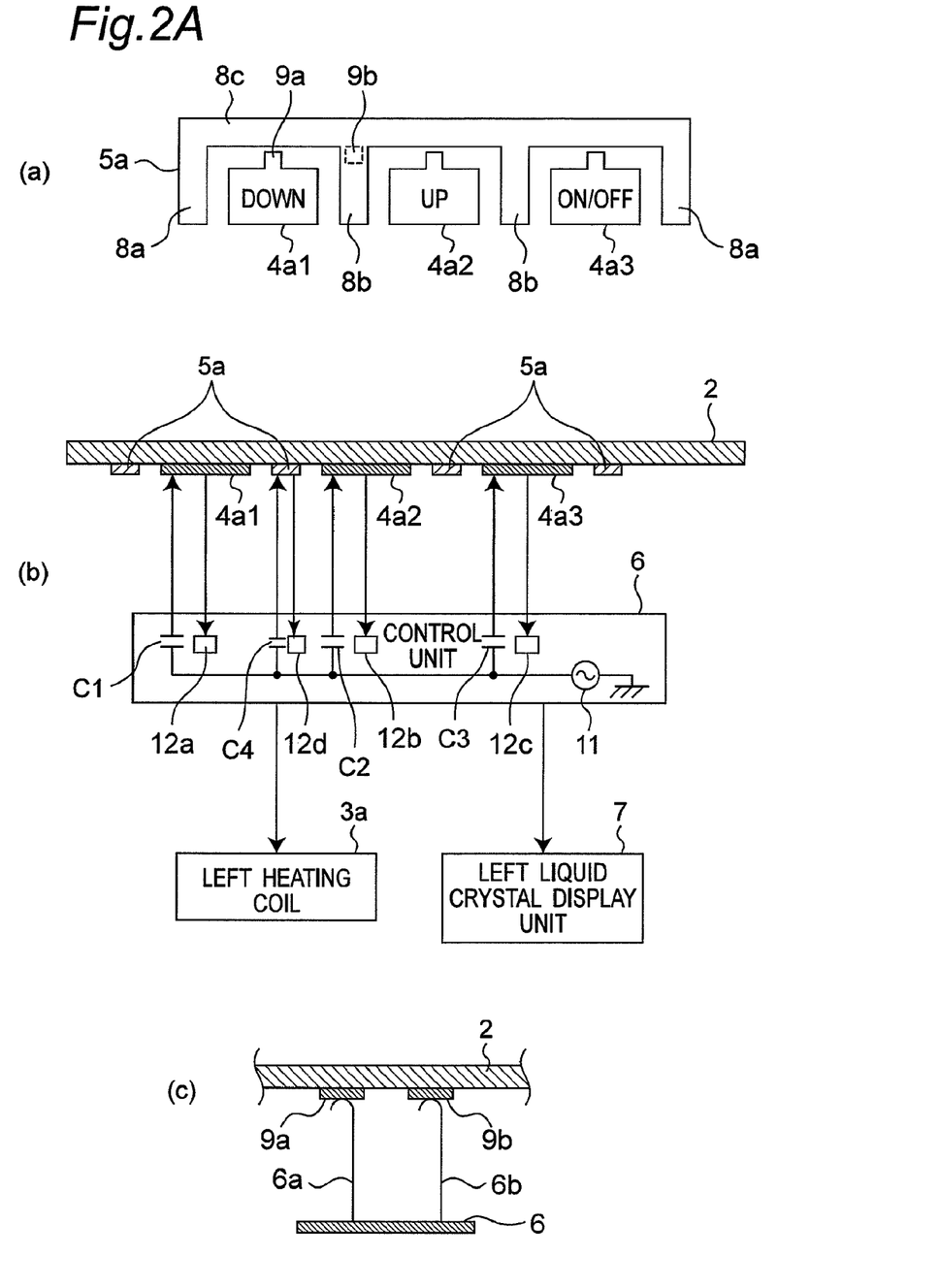
FIG. 2A is a diagram illustrating a structure of touch switches in the cooking device according to the first embodiment of the present invention, wherein (a) is a plan view, (b) is a front view, and (c) is a front view illustrating a connection portion between a control unit and electrodes.
Figure 2B:
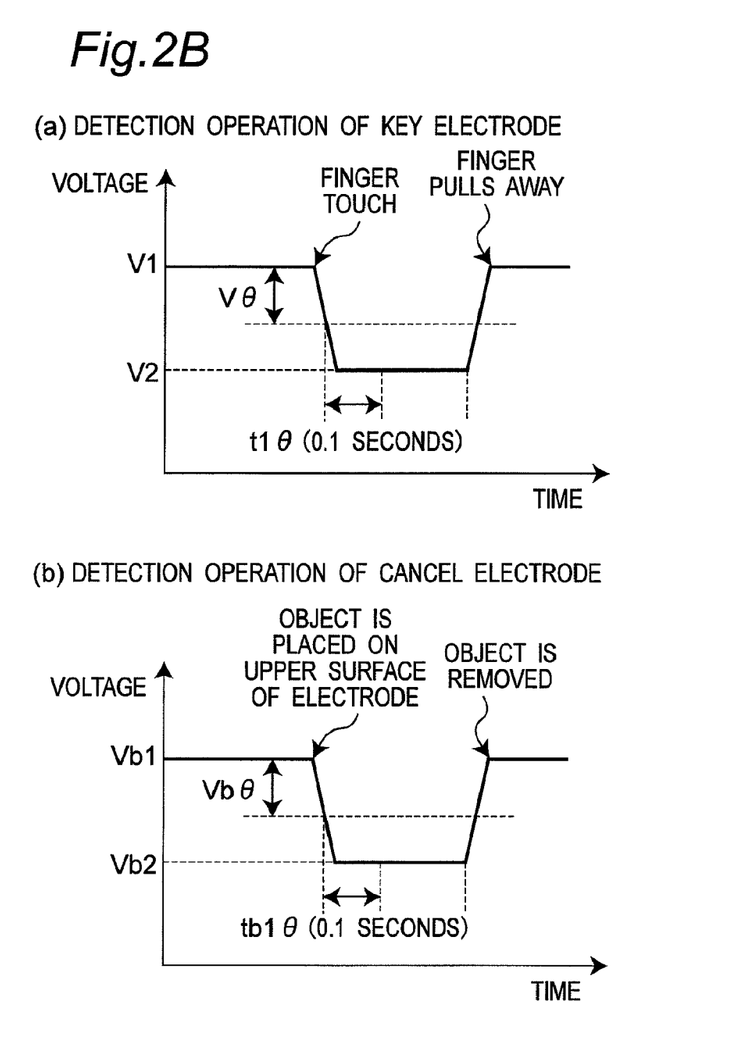
FIG. 2B is a chart illustrating detection operations according to the first embodiment of the present invention, wherein (a) illustrates detection operations of key electrodes, and (b) illustrates detection operations of a cancel electrode.

FIG. 2A illustrates the left touch switches in detail. FIG. 2B illustrates touch switch detection signals in the control unit 6. The key electrodes 4a1, 4a2 and 4a3 constituting the respective touch switches are formed from a conductive material by printing them on the lower surface of the top plate. There is also formed a capacitor structure having, as a dielectric body, the portions of the top plate 2 made of an insulating material (in this case, a heat-resistant glass such as a crystallized ceramic) which are directly above the electrodes, and having, as opposite electrodes, the surfaces of these portions directly above the electrodes and the key electrodes 4a1, 4a2 and 4a3. The control unit 6 is formed on a printed wiring board and, for example, conductive and elastic connection terminals 6a and 6b which are connected and secured at their one ends to the control unit 6 come into contact with the electrode 4a1 and the cancel electrode 5a at their other ends, so that the control unit 6 is connected to the key electrode 4a1 and the cancel electrode 5a. The control unit 6 can also be connected to the other key electrodes and the other cancel electrode, in the same manner. The cancel electrode 5a is formed to have a comb shape in its entirety with a band-shaped rear portion 8c provided in the rear of the key electrodes, and side portions 8a and 8b beside the key electrodes. A connection portion 9a is formed by providing a rearward-protruding portion to the key electrode 4a1. The cancel electrode 5a is provided, in its side portions 8b, with a connection portion 9b. The connection terminal 6a is contacted at its tip end with the connection portion 9a by pressure welding, and the connection terminal 6b is contacted at its tip end with the connection portion 9b by pressure welding. It is more preferable, in setting the input sensitivity, that the connection portion 9b in the cancel electrode 5a is provided in the inner side portions 8b rather than in the outer side portions 8a, since, in this case, it is possible to make a capacitance difference between the cancel electrode 5a and the portion touched by a hand smaller, when viewed from the control unit 6.

If a person's finger touches a portion of the top plate upper surface which is faced to the key electrodes 4a1, 4a2 and 4a3 of the respective switches, the portion of the top plate upper surface is coupled to the ground capacitance through the human body, which increases the capacitance between the respective key electrodes and the ground when viewed from the control unit 6. The control unit 6 is capable of causing the respective key electrodes 4a1, 4a2 and 4a3 to function as capacitance-type switches, by detecting the change of the aforementioned capacitance. For example, by maintaining the impedance between the ground and the common potential of the control unit 6 at a constant value, the control unit 6 is enabled to detect the changes of the capacitances between the common potential and the key electrodes 4a1, 4a2 and 4a3. In order to determine the capacitance changes, for example, respective capacitors can be connected at their one ends to the key electrodes 4a1, 4a2, 4a3 and the cancel electrode 5a having predetermined capacitances, a high-frequency voltage from a high-frequency power supply 11 can be applied between the common potential and the other ends of the respective capacitors, and the voltages applied between the common electrode and the key electrodes 4a1, 4a2 and 4a3 as a result of the voltage division can be inputted to key-electrode voltage detection sections 12a to 12c and a cancel-electrode voltage detection section 12d, which can determine the voltages resulted from the voltage division. In the present embodiment, the voltages resulted from the voltage division which are alternating voltages are further rectified to be converted into direct voltages to obtain key-electrode detection voltages and a cancel-electrode detection voltage. If a person's finger touches a portion of the top plate upper surface which is faced to the key electrodes 4a1, 4a2 and 4a3 of the respective switches, as illustrated in FIG. 2B, the key-electrode detection voltage is changed from a reference detection voltage V1, which is a detection voltage at a no-touch state, to a detection voltage value V2 at a touch-presence state, which is a lower voltage than the reference detection voltage V1. The control unit 6 sets the key-electrode detection voltage determined at the time when the power switch 10 is turned on, as an initial value of the reference detection voltage V1. When the cancel electrode 5a is at a no-reception state, the control unit 6 validates reception by each of the key electrodes 4a1, 4a2 and 4a3, if the determined key-electrode detection voltage V changes, the voltage change from the reference detection voltage V1 exceeds a preset first predetermined amount Vθ of voltage reduction, and also this condition continues for a preset first predetermined time t1θ (in this case, 0.1 seconds, for example).

If a person touches the left heating on/off switch 4a, a signal therefrom is inputted to the control unit 6. The control unit 6 performs control for turning on and off the left heating coil 3a and displays the operation condition on the left liquid crystal display unit 7a. If a person touches the left down switch 4a1 or the left up switch 4a2, a signal therefrom is inputted to the control unit 6. The control unit 6 increases or decreases the heating output from the left heating coil 3a. Further, at this time, the control unit 6 also displays the operation condition on the left liquid crystal display unit 7a.

As illustrated in FIG. 2A, similarly to the respective switches, the left cancel electrode 5a also has a conductive cancel electrode on the top plate lower surface and forms a capacitor structure having, as a dielectric body, the portion of the top plate 2 made of an insulation material (a glass, in this case) directly above the electrode. When the cancel electrode 5a is viewed from the top plate upper surface, the cancel electrode 5a exists between the left heating coil 3a and the respective key electrodes and is placed to surround the respective key electrodes.

Since the left cancel electrode has the capacitor structure similarly to the respective switches, if an object with a high conductivity or an object with a larger capacitance relative to the ground, such as a cloth wetted with water or a PET bottle containing seasoning, is placed on the top plate upper surface which is faced to the cancel electrode, as illustrated in a portion (b) of FIG. 2B, the cancel-electrode detection voltage of the left cancel electrode changes from the reference detection voltage Vb1 to Vb2. The control unit 6 sets the cancel-electrode detection voltage Vb1 determined at the time when the power switch 10 is turned on, that is, when there is no object above the cancel electrode 5a; as an initial value of the reference detection voltage of the cancel electrode. The control unit 6 validates reception by the cancel electrode 5a, if the control unit 6 continuously detects a voltage lower than the reference detection voltage Vb1 by an amount exceeding a preset second predetermined amount Vbθ of voltage reduction for a preset second predetermined time tb1θ (0.1 seconds, in this case). Hereinafter, the state where the cancel electrode 5a is valid will be referred to as "the cancel electrode 5a is at an ON state", in some cases.

If an object is placed on the top plate 2 over the left cancel electrode 5a, a signal from the left cancel electrode 5a is inputted to the control unit 6. Even if the control unit 6 continuously detects, from each key electrode, a voltage lower than the key-electrode reference detection voltage V1 by an amount of reduction which exceeds the first predetermined amount Vθ of voltage reduction, as a detection signal V from the key electrode, for the first predetermined time t1θ, the control unit 6 invalidates inputting operations on each touch switch. By performing the aforementioned operation, it is possible to invalidate operations on the switches, in the case of adhesion of water or cooked food around the touch switches, wiping with a damp cloth or the like. This prevents the operation condition from being changed even though the user does not intend to do so. Accordingly, usability is improved.

Further, the cancel electrode 5a for detecting the peripheral condition is provided between the heating coil and the key electrodes and, therefore, even if the user performs a shaking operation of a pan or the like, which is an object to be heated, and moves the pan to the touch switch portions, the pan induces a voltage change in the cancel electrode, which causes the same detection as that in the case of the aforementioned operations. This prevents the occurrence of unintended operation transitions. Accordingly, the usability is further improved.

Figure 3A:
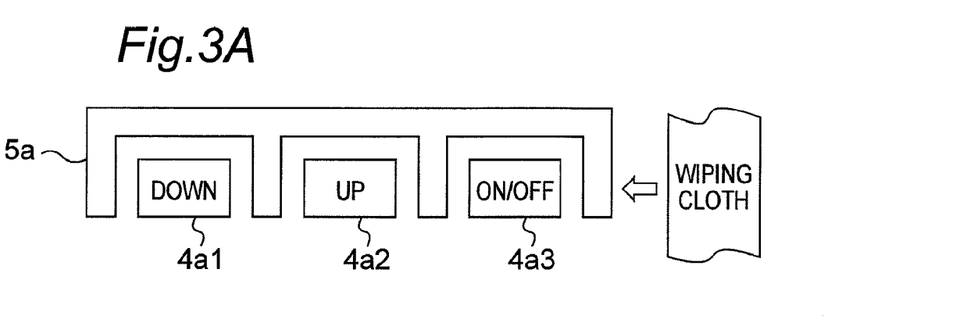
FIG. 3A is a diagram of an exemplary wiping operation according to the first embodiment of the present invention.
Figure 3B:
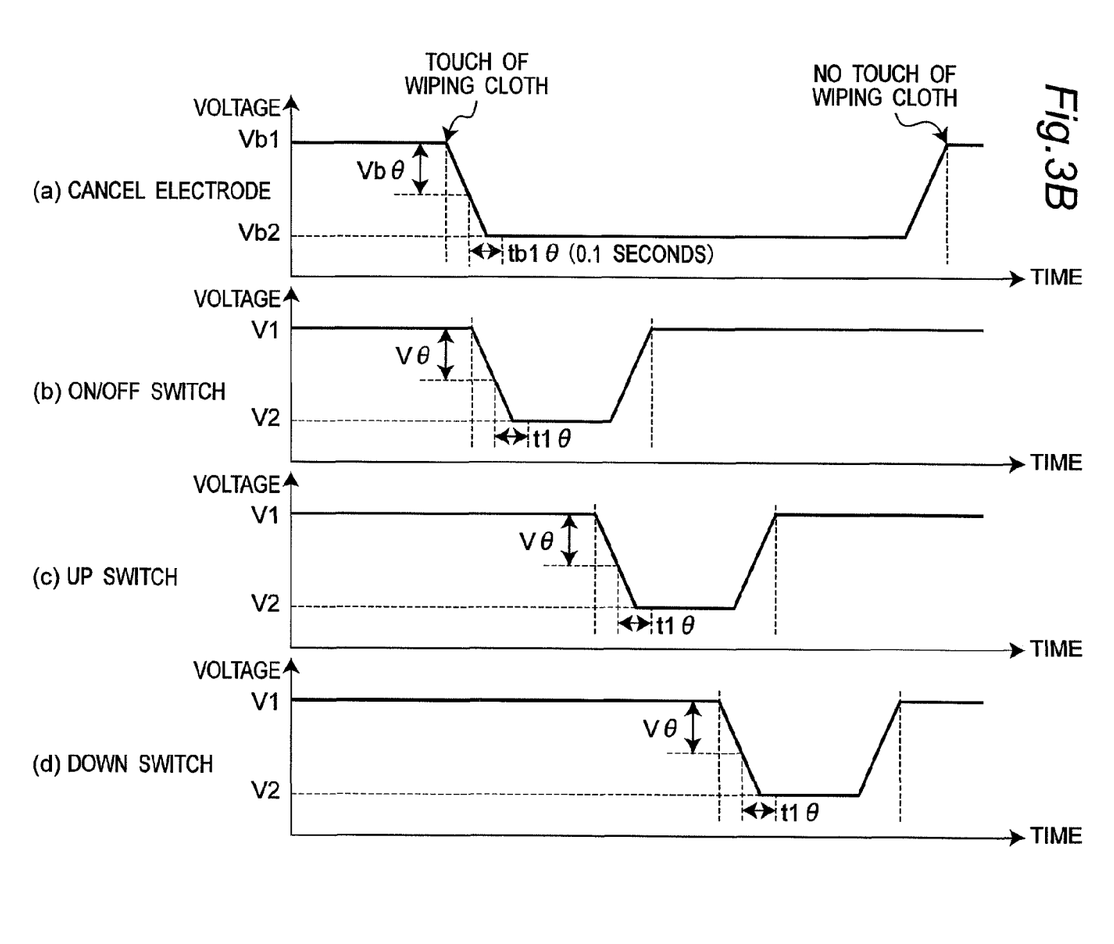
FIG. 3B is a chart of exemplary touch switch detection operations upon wiping according to the first embodiment of the present invention.

FIGS. 3A and 3B illustrate detection operations in a case where the switch portions are wiped with a damp cloth, according to the present embodiment. If cleaning is performed by wiping using with the damp cloth in the leftward direction from a right position of the heating on/off switch as illustrated in FIG. 3A, the cancel-electrode detection voltage is reduced from the cancel-electrode reference detection voltage Vb1 to Vb2, at first, as illustrated in FIG. 3B. If the amount of this voltage reduction is equal to or more than the second predetermined amount Vbθ of voltage reduction, and this condition continues for the second predetermined time tb1θ (for example, 0.1 seconds, in this case), it is determined that the capacitance of the cancel electrode 5a has increased by an amount equal to or more than the second predetermined amount.

The damp cloth is moved in the left-to-right direction and, therefore, subsequently to the turn-on of the cancel electrode 5a, similar voltage reduction occurs in the detection voltages V of the key electrodes, in the order of the key electrode 4a3 of the heating on/off switch, the key electrode 4a2 of the up switch and the key electrode 4a1 of the down switch. In the example, their changes are over ranges equal to or more than the first predetermined amount Vθ of voltage reduction, and are continued for a time equal to or more than the first predetermined time t1θ.

In the present embodiment, when the key-electrode command-inputting prohibiting effect of the cancel electrode is valid, even if the control unit 6 detects that the detection voltage V detected from each key electrode 4a3, 4a2, 4a1 has been reduced by an amount of reduction which is equal to or more than the first predetermined amount Vθ of voltage reduction, and this condition has continued for a time equal to or more than the first predetermined time t1θ, the control unit 6 invalidates inputting operations for control-command through the key electrodes 4a1, 4a2 and 4a3. On the other hand, when the cancel electrode 5a is not at an ON state, if the switch detection voltage detected from each key electrode 4a1, 4a2, 4a3 is reduced by an amount equal to or more than the first predetermined amount Vθ of voltage reduction, and this condition continues for a time equal to or more than the first predetermined time t1θ, the control unit 6 validates inputting operations for control-command through the key electrode 4a1, 4a2 and 4a3. This can prevent the touch switches from performing reception even through it is not intended during wiping with a damp cloth or the like. The changeover between validity and invalidity of respective touch switch operations is performed based on whether or not the cancel electrode 5a is at a valid state, which enables performing respective switch operations at desired detection levels, at a state where no object exists around the respective touch switches.

As described above, according to the present embodiment, it is possible to easily distinguish actual switch operations from cases of adhesion of cooked food or wiping with a damp cloth and the like, which prevents the operation condition from being changed even though the user does not intend to do so. This improves the usability.

Further, in the present embodiment, the cancel electrode 5a is provided between the heating coil and the key electrodes and, accordingly, even if the user performs a shaking operation and the like on a pan or the like, which is an object to be heated, and moves the pan to the touch switch portions, the cancel electrode is made valid and, thereafter, detection operations are performed by the respective switches, similarly in the case of the wiping with the damp cloth in FIG. 3. This can invalidate inputting through the respective switches. In the cases of pan shaking operations and the like, similarly, no unintended operation transition occurs, thereby further improving the usability.

Figure 4A:
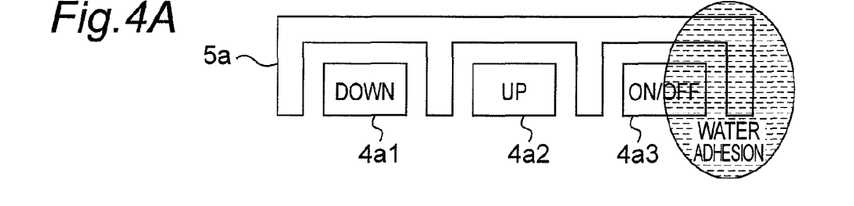
FIG. 4A is a diagram of exemplary water adhesion, according to the first embodiment of the present invention.
Figure 4B:
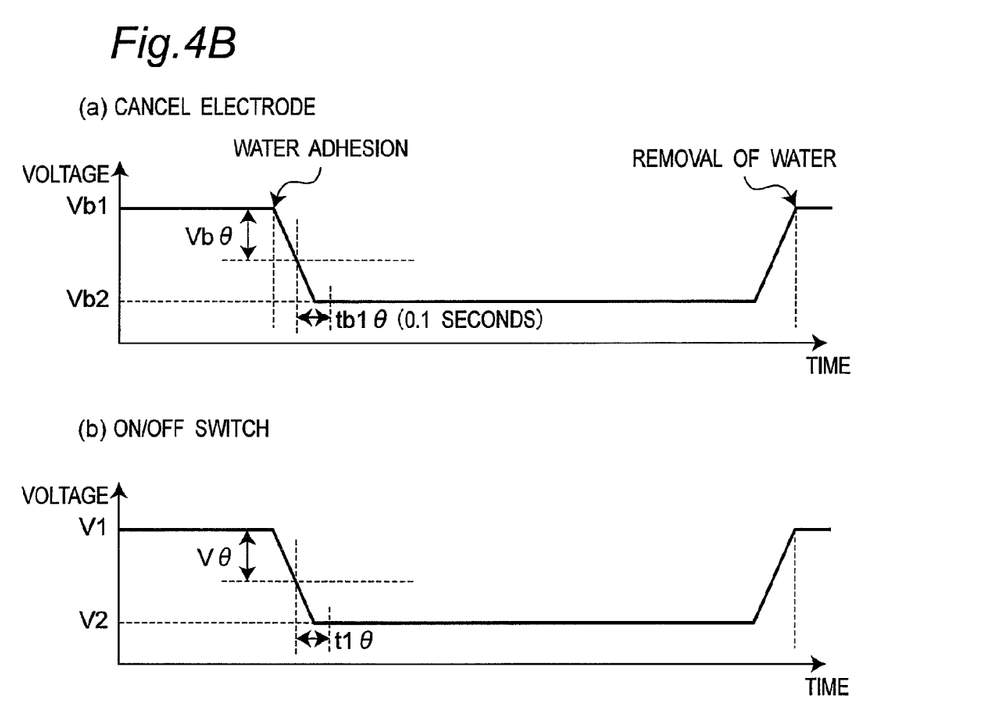
FIG. 4B is a chart of exemplary touch switch detection operations upon water adhesion, according to the first embodiment of the present invention.

FIGS. 4A and 4B illustrate detection operations in a case where water is adhered to the touch switch portions, according to the present embodiment. As illustrated in FIG. 4A, if water is adhered to the surface of the top plate 2 just above the key electrode 4a1 of the heating on/off switch and the cancel electrode 5a, the detection voltage Vb of the cancel electrode 5a is reduced by an amount equal to or more than the second predetermined amount Vbθ of voltage reduction, and this condition continues for a time equal to or more than the second predetermined time tb1θ, which validates the key-electrode control-command inputting prohibiting function of the cancel electrode 5a. At substantially the same time, the detection voltage of the key electrode 4a3 of the heating on/off switch changes such that it reduces by an amount of reduction which is equal to or more than the first predetermined amount Vθ of voltage reduction, and this condition continues for a time equal to or more than the first predetermined time t1θ. However, since the key-electrode control-command inputting prohibiting function of the cancel electrode 5a has been made valid, inputting operations through the key electrode 4a1 of the heating on/off switch are invalid. In the present embodiment, when the key-electrode control-command inputting prohibiting function of the cancel electrode 5a is valid, inputting operations through the key electrode 4a1 of the heating on/off switch are invalid, which prevents heating operations from being unintentionally turned off due to spill of water and the like during heating and the like. The changeover between validity and invalidity of respective touch switch operations is performed based on the state of the cancel electrode 5a, which enables performing respective touch switch operations at desired detection levels, at a state where no object exists around the respective touch switches.

During heating, particularly, water droplets or cooked food can be scattered with higher frequency and, in particular, in cases of devices having auto-cooking functions, such as auto rice cooking functions, unintended turn-off of heating during heating and the like induces disposal of cooked food. Accordingly, it is significantly effective to suppress erroneous heating turn-off operations with the cancel electrode.

While, in the present embodiment, there has been described a method of detecting the changes of the capacitances of the key electrodes and the cancel electrode from divided voltages using a high-frequency voltage as a power supply, it is also possible to employ a pulse count method for determining the capacitance changes through the electrodes, using a high-frequency voltage as a power supply, which can also provide the same effects.

Further, while, in the present embodiment, the heating sections have been described as being adapted to perform induction heating, the heating sections can also be adapted to perform electrothermal heating, heating with radiant heaters or gas heating, which can also offer the same effects.

Further, the liquid crystal display units serving as the informing sections also have the function of, when the key electrodes have been invalidated by the function of the cancel electrode, displaying this fact. This enables informing the user of the condition around the touch switches, which offers the effect of encouraging the user to remove adherent water, objects placed around the touch switches, or the like.

Further, the cancel electrode 5a is provided with the band-shaped rear portion 8c which separates the cancel electrode 5a from the area in the rear thereof and with the band-shaped side portions 8a which separate the cancel electrode 5a from the lateral areas, so that they form an outside surrounding, which enhances the aforementioned effects. Further, there are provided the side portions 8b between the key electrodes, which further enhances the effects.

Further, the control unit 6 may include the cancel-electrode voltage detection section 12d which applies a high-frequency voltage having a predetermined voltage value to the cancel electrode 5a with a capacitor C4 with a predetermined capacitance interposed therebetween, and detects the magnitude of the high-frequency voltage applied to the cancel electrode as a result of the division of the high-frequency voltage by the capacitance of the capacitor C4 and the capacitance of the cancel electrode. Further, the control unit 6 may be adapted to detect the amount of increase in the capacitance of the cancel electrode, based on the amount of reduction of the voltage detected by the cancel-electrode voltage detection section 12d from the set cancel-electrode reference detection voltage. This enables employing only a single common signal line, as a signal line for applying the high-frequency voltage to the cancel electrode 5a and a signal line for determining the voltage of the cancel electrode 5a, which can simplify the connection between the control unit 6a and the cancel electrode 5a. Further, it is possible to employ the same structure for the key electrodes 4a1 to 4a3, which can simplify the entire structure.

The cancel-electrode voltage detection section 12d can be adapted to connect the cancel electrode 5a to one end of the capacitor C4 having a predetermined capacitance value, apply a high-frequency voltage to the other end of the capacitor C4, further rectify the voltage applied to the cancel electrode 5a as a result of the division of the high-frequency voltage to convert the voltage into a direct voltage, and then output the same. This causes the output from the cancel-electrode voltage detection section to be a direct voltage, which enables the control unit to easily determine the detection voltages with higher accuracy and also to alleviate the influence of external high-frequency noise. This can realize capacitance-type touch keys with excellent stability. Further, it is also possible to employ the same structure for the key electrodes, which can simplify the entire structure.

Second Embodiment

A cooking device according to the second embodiment of the present invention has the structure illustrated in FIG. 1. Accordingly, the description thereof will not be given. In the present embodiment, the control unit 6 invalidates inputs to the respective touch switches, while the cancel electrode 5a is continuously at an ON state for a time which is equal to or more than a second predetermined time tb1 (for example, 0.1 seconds, in this case) but is less than a third predetermined time tb2 (for example, 5 seconds, in this case). Further, the control unit 6 invalidates inputs to the respective touch switches, while the cancel electrode 5a is continuously at an ON state for a time which is equal to or more than the third predetermined time tb2 (for example, 5 seconds, in this case).

Figure 5A:
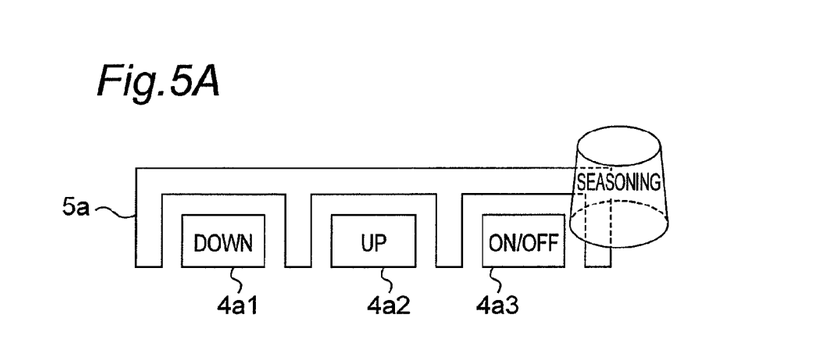
FIG. 5A is a diagram of exemplary placement of an object on a cancel electrode according to the second embodiment of the present invention.
Figure 5B:
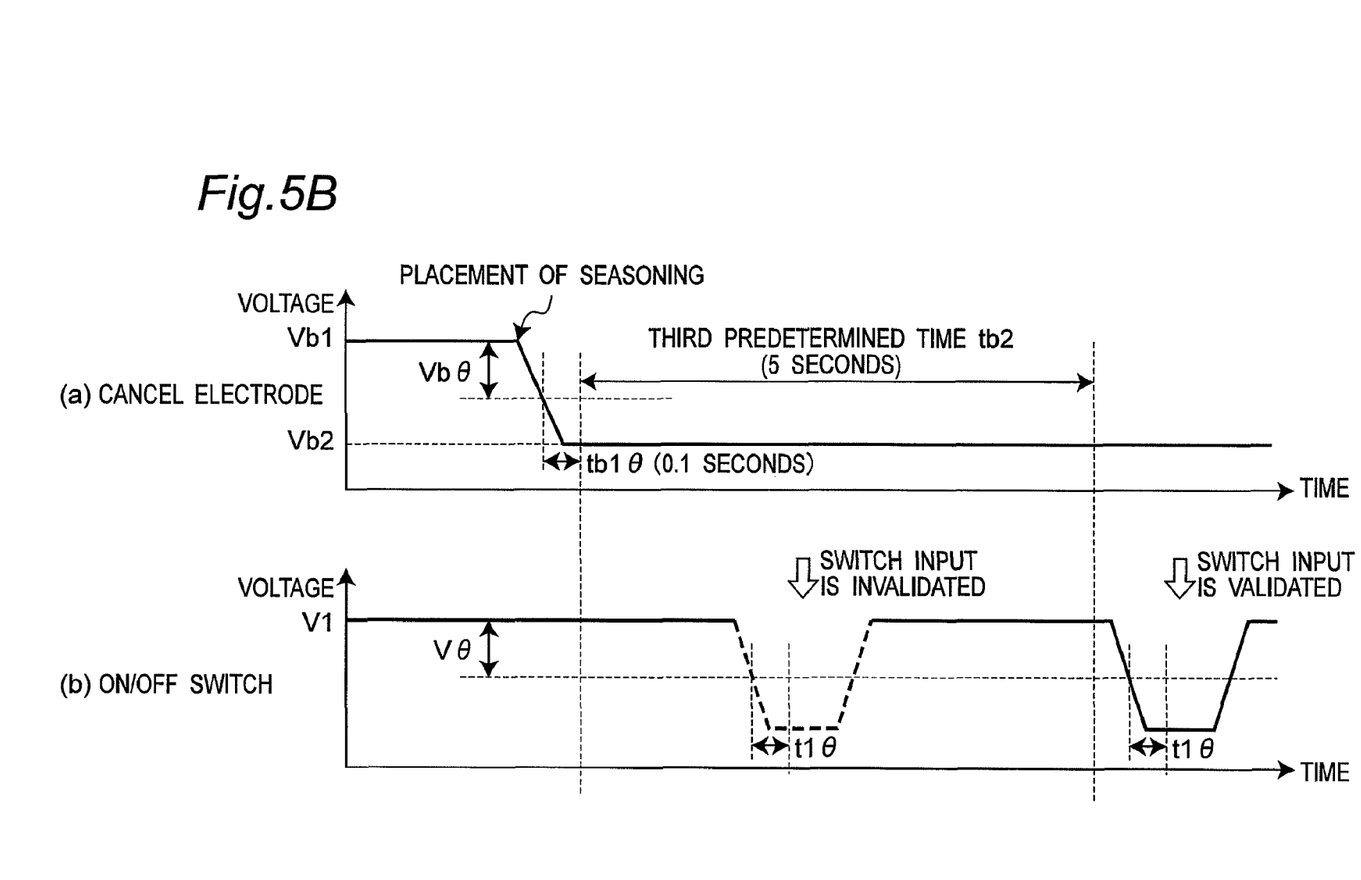
FIG. 5B is a chart of exemplary touch switch detection operations when an object is placed on the cancel electrode according to the second embodiment of the present invention.

The present embodiment has a greatest characteristic of being capable of changing over between validity and invalidity of inputting operations through the respective touch switches, based on the time period during which the cancel electrode 5a is continuously at an ON state. Accordingly, as illustrated in FIGS. 5A and 5B, when a container containing seasoning or the like is placed above the cancel electrode 5a, it is possible to prevent inputs to the respective touch switches from being continuously invalidated. In the event of the occurrence of capacitance changes in the respective key electrodes 4a1, 4a2 and 4a3 due to operations for relatively shorter time periods such as wiping with a damp cloth, the respective touch switches are made invalid. Further, in the event of the occurrence of a capacitance change in the cancel electrode 2a for a longer time period, due to placement of seasoning or the like on the top plate 2 over the cancel electrode 2a, adhesion of water to the top plate 2 at the position of only the cancel electrode 5a, and the like, the respective touch switches are validated, again. This can prevent erroneous reception during wiping, and also can prevent malfunctions such as impossibility of inputting operations through the touch switches, in the event that an object is placed or water is adhered around the switches. This can realize optimum switch operations for the usage environment, which improves the usability.

Third Embodiment

A cooking device according to the third embodiment of the present invention has the structure illustrated in FIG. 1. Accordingly, the description thereof will not be given. In the present embodiment, while the detection voltage Vb of the cancel electrode 5a is reduced by an amount of reduction which is equal to or more than a second predetermined amount Vbθ of voltage reduction from a reference detection voltage Vb1, and also this condition continues for a time which is equal to or more than a second predetermined time t1b (0.1 seconds, in this case) but is less than a third predetermined time t2b (5 seconds, in this case), operations for inputting control commands through the key electrodes 4a1, 4a2 and 4a3 of the respective touch switches are made invalid. Further, if the detection voltage Vb of the cancel electrode 5a is reduced by the second predetermined amount from the reference detection voltage Vb1, and the cancel electrode 5a is continuously at an ON state for a time equal to or more than the third predetermined time t2b (5 seconds, in this case), the reference detection level is forcibly replaced with the current detection level (the cancel-electrode reference detection voltage Vb1 is replaced with Vb2).

Figure 6A:
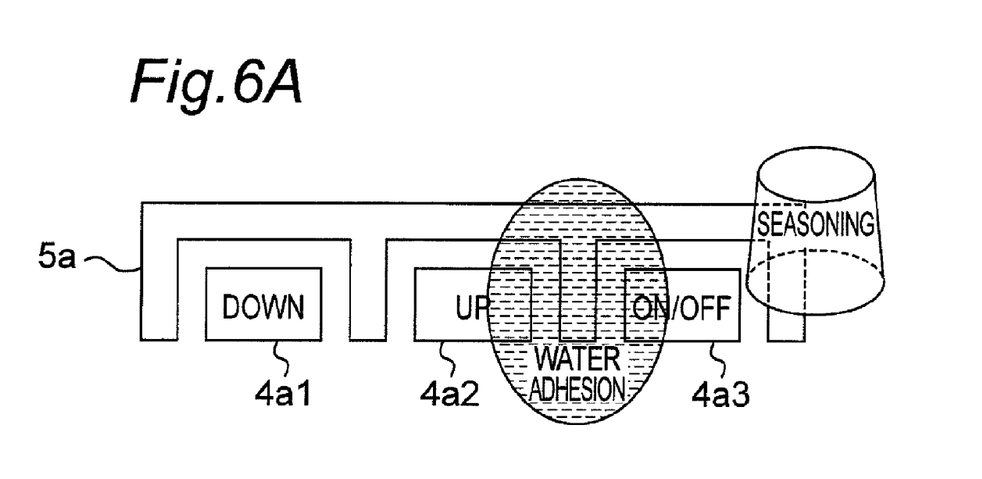
FIG. 6A is a diagram of exemplary placement of an object above a cancel electrode according to the third embodiment of the present invention.
Figure 6B:
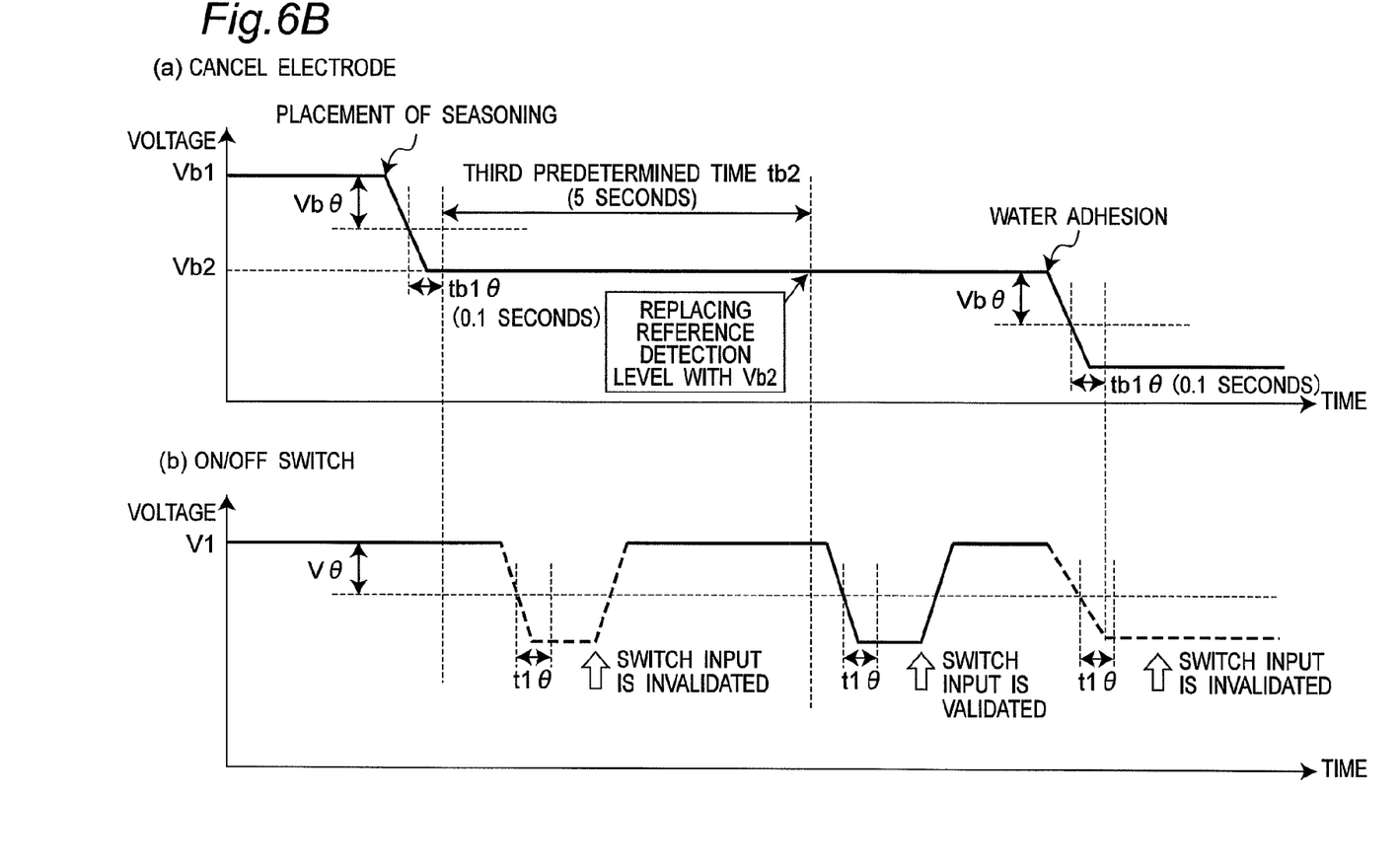
FIG. 6B is a chart of exemplary touch switch detection operations when an object is placed on the cancel electrode according to the third embodiment of the present invention.

As illustrated in FIGS. 6A and 6B, when a container containing seasoning and the like is placed over the cancel electrode 5a, it is possible to prevent the respective touch switches from being continuously at a state where inputting operations for control-command therethrough are invalid. Key operations are made invalid for a time which is equal to or more than the second predetermined time tb1 (0.1 seconds in this case) but less than the third predetermined time tb2 (5 seconds, in this case), in order to prevent erroneous inputting through the switches during wiping using a damp cloth and the like. Accordingly, the usability is improved. Further, in the present embodiment, if the cancel-electrode detection voltage Vb is reduced from the reference detection voltage Vb1 by an amount of reduction equal to or more than the second predetermined amount Vbθ of voltage reduction, and also this condition continues for a time equal to or more than the third predetermined time tb2 (5 seconds, in this case), the value Vb1 set as the reference detection voltage of the cancel electrode is changed to be replaced with the currently-detection voltage Vb2, rather than simply invalidating touch switch operations. Thus, after the elapse of a time equal to or more than the third predetermined time tb2 (5 seconds in this case), switch operations are temporarily validated, and also if the cancel-electrode detection voltage Vb is further reduced from the current detection voltage Vb2 (the reference detection level after the elapse of the third predetermined time tb2 or more) by an amount of reduction equal to or more than the second predetermined amount Vbθ of voltage reduction, the switch-inputs invalidating function is exerted.

As described above, since the reference detection voltage of the cancel electrode is changed from the preliminarily-set value Vb1 to the current detection voltage V2 after the elapse of a time equal to or more than the third predetermined time tb2 (5 seconds, in this case), as in the present embodiment, it is possible to suppress erroneous switch detections due to adhesion of water and, further, it is possible to suppress erroneous operations during wiping with a damp cloth or the like, even at states where seasoning is placed over the cancel electrode portion as in FIG. 6. Accordingly, the usability is improved.

Further, after the elapse of a time equal to or more than the third predetermined time t2b (5 seconds, in this case), the reference detection level is replaced with the currently detected level. This can prevent malfunctions such as impossibility of switch operations, in the event that an object is placed or water is adhered around the switches. Accordingly, the usability is improved.

Fourth Embodiment

Figure 7:
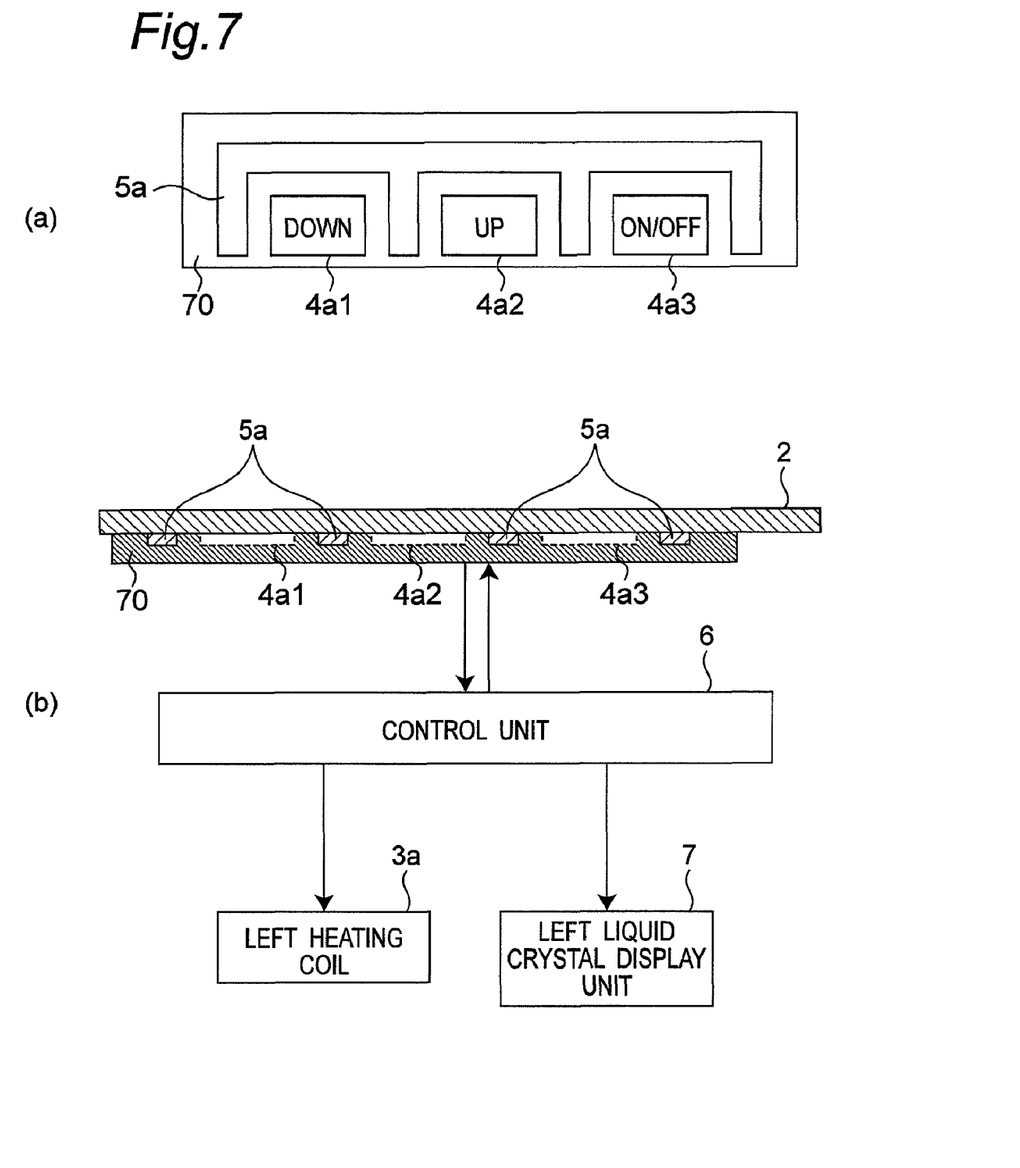
FIG. 7 is a structural diagram of touch switches in the cooking device according to the fourth embodiment of the present invention.

A cooking device according to the fourth embodiment of the present invention has the structure illustrated in FIG. 1. Accordingly, the description thereof will not be given. FIGS. 7 (a) and (b) illustrate the structures of the left switches, in detail. The respective switches are individually provided as copper-foil conductors on a printed wiring board 70 placed just under the top plate. Further, similarly, the cancel electrode is individually provided as a copper-foil conductor on the printed wiring board 70. The respective switches and the cancel electrode have a capacitor structure having the portions of the top plate 2 which are directly on the copper-foil conductors as a dielectric body, and are structured to detect switch operations and objects placed over the cancel electrode, based on the changes of their capacitances. As illustrated in the portion (b) of FIG. 7, for example, a double-sided printed wiring board can be employed, and the control unit 6 can be partially or entirely placed on the rear side of the surface on which the electrode patterns are formed for optimizing and minimizing the wirings for connecting it to the left heating coil and the left liquid crystal display unit, which realizes an inexpensive structure.

INDUSTRIAL APPLICABILITY

The cooking device according to the present invention is capable of determining whether or not a user has intentionally operated touch switches, and also is capable of changing over between validity and invalidity of switch operations. Accordingly, the present invention can be applied to applications of gas cooking devices, as well as to electric heating and induction heating.

The invention claimed is:
1. A cooking device comprising:
a main body serving as housing;
a top plate provided on an upper surface of the main body;
a heating section operable to heat an object to be heated;
capacitance-type touch switches, each of which includes a key electrode provided on a back surface of the top plate; and
a control unit operable to detect capacitances formed between the key electrodes and a ground, the control unit determining that the key electrode is pushed to input a control command assigned to the pushed key electrode, when detecting, for a time equal to or more than a first predetermined time, that the capacitance of any of the key electrodes is increased by an amount equal to or more than a first predetermined amount based on a value set as a reference capacitance of the key electrodes;

wherein the cooking device further comprises a cancel electrode located near the key electrodes and between a position at which the heating section is placed and a position at which the key electrodes are placed, the control unit detects a capacitance formed between the cancel electrode and the ground, when the control unit continuously detects, for a time equal to or more than a second predetermined time but less than a third predetermined time, that the capacitance of the cancel electrode is increased by an amount equal to or more than a second predetermined amount based on a value set as a reference capacitance of the cancel electrode, the control unit prohibits execution of a control command assigned to a key electrode even if determining that the key electrodes is pushed, and when the control unit continuously detects, for a time equal to or more than the third predetermined time, that the capacitance of the cancel electrode is increased by an amount equal to or more than the second predetermined amount from the reference capacitance of the cancel electrode, the control unit executes a control command assigned to a key electrode if determining that the key electrode is pushed.

2. The cooking device according to claim 1, wherein, when the control unit continuously detects, for a time equal to or more than the second predetermined time but less than the third predetermined time, that the capacitance of the cancel electrode is increased by an amount equal to or more than the second predetermined amount based on the reference capacitance of the cancel electrode, the control unit prohibits execution of at least a control command for turning off a heating operation even if determining that the key electrode assigned to the control command for turning off a heating operation is pushed.

3. The cooking device according to claim 1, further comprising a power switch operable to change a state from a state in which no control command can be inputted through all of the key electrodes to a state in which a control command assigned to at least one of the key electrodes can be inputted by pushing the at least one key, wherein the control unit sets the capacitances of the key electrodes and the cancel electrode when the power switch is turned on, as initial values of reference capacitances of the key electrodes and the cancel electrode, respectively.

4. The cooking device according to claim 3, wherein the control unit includes a cancel-electrode voltage detection section for applying a high-frequency voltage having a predetermined voltage to the cancel electrode through a capacitor having a predetermined capacitance and detecting magnitude of the high-frequency voltage which is divided by the capacitance of the capacitor and the capacitance of the cancel electrode and is applied to the cancel electrode, and the control unit detects the amount of increase in the capacitance of the cancel electrode, according to an amount of reduction of the voltage detected by the cancel-electrode voltage detection section based on a set cancel-electrode reference detection voltage.

5. The cooking device according to claim 4, wherein the cancel-electrode voltage detection section connects the cancel electrode to one end of the capacitor having a predetermined capacitance, applies a high-frequency voltage to the other end of the capacitor, rectifies and converts the divided voltage of the high-frequency voltage which is applied to the cancel electrode to a direct voltage, and outputs the direct voltage.

6. The cooking device according to claim 1, further comprising an informing section, wherein, when the control unit prohibits the execution of the input commands from the key electrodes since the control unit continuously detects, for a time equal to or more than the second predetermined time but less than the third predetermined time, that the capacitance of the cancel electrode is increased by an amount equal to or more than the second predetermined amount based on the reference capacitance of the cancel electrode, the informing section generates a notification of this fact with a sound or light.

7. The cooking device according to claim 1, wherein the key electrode or the cancel electrode is formed from a copper-foil conductor of a printed wiring board, and the printed wiring board is placed beneath the top plate.

8. A cooking device comprising:
a main body serving as shell;
a top plate provided on an upper surface of the main body;
a heating section operable to heat an object to be heated;
capacitance-type touch switches, each of which includes a key electrode provided on a back surface of the top plate; and
a control unit operable to detect capacitances formed between the key electrodes and a ground, the control unit determining that the key electrode is pushed to execute a control command assigned to the pushed key electrode, when detecting, for a time equal to or more than a first predetermined time, that the capacitance of any of the key electrodes is increased by an amount equal to or more than a first predetermined amount based on a value set as a reference capacitance of the key electrodes;

wherein the cooking device further comprises a cancel electrode located near the key electrodes and between a position at which the heating section is placed and a position at which the key electrodes are placed;

the control unit detects a capacitance formed between the cancel electrode and the ground, when the control unit continuously detects, for a time equal to or more than a second predetermined time but less than a third predetermined time, that the capacitance of the cancel electrode is increased by an amount equal to or more than a second predetermined amount based on a reference capacitance of the cancel electrode, the control unit prohibits execution of a control command assigned to a key electrode even if determining that the key electrodes is pushed, and when the control unit continuously detects, for a time equal to or more than the third predetermined time, that the capacitance of the cancel electrode is increased by an amount equal to or more than the second predetermined amount based on the value set as the reference capacitance of the cancel electrode, the control unit replaces the reference capacitance of the cancel electrode with the currently-detected capacitance of the cancel electrode and executes a control command assigned to a key electrode when determining that the key electrodes is pushed.

9. The cooking device according to claim 8, wherein, when the control unit continuously detects, for a time equal to or more than the second predetermined time but less than the third predetermined time, that the capacitance of the cancel electrode is increased by an amount equal to or more than the second predetermined amount based on the reference capacitance of the cancel electrode, the control unit prohibits execution of at least a control command for turning off a heating operation even if determining that the key electrode assigned to the control command for turning off a heating operation is pushed.

10. The cooking device according to claim 8, further comprising a power switch operable to change a state from a state in which no control command can be inputted through all of the key electrodes to a state in which a control command assigned to at least one of the key electrodes can be inputted by pushing the at least one key, wherein the control unit sets the capacitances of the key electrodes and the cancel electrode when the power switch is turned on, as initial values of reference capacitances of the key electrodes and the cancel electrode, respectively.

11. The cooking device according to claim 10, wherein the control unit includes a cancel-electrode voltage detection section for applying a high-frequency voltage having a predetermined voltage to the cancel electrode through a capacitor having a predetermined capacitance and detecting magnitude of the high-frequency voltage which is divided by the capacitance of the capacitor and the capacitance of the cancel electrode and is applied to the cancel electrode, and the control unit detects the amount of increase in the capacitance of the cancel electrode, according to an amount of reduction of the voltage detected by the cancel-electrode voltage detection section based on a set cancel-electrode reference detection voltage.

12. The cooking device according to claim 11, wherein the cancel-electrode voltage detection section connects the cancel electrode to one end of the capacitor having a predetermined capacitance, applies a high-frequency voltage to the other end of the capacitor, rectifies and converts the divided voltage of the high-frequency voltage which is applied to the cancel electrode to a direct voltage, and outputs the direct voltage.

13. The cooking device according to claim 8, further comprising an informing section, wherein, when the control unit prohibits the execution of the input commands from the key electrodes since the control unit continuously detects, for a time equal to or more than the second predetermined time but less than the third predetermined time, that the capacitance of the cancel electrode is increased by an amount equal to or more than the second predetermined amount based on the reference capacitance of the cancel electrode, the informing section generates a notification of this fact with a sound or light.

14. The cooking device according to claim 8, wherein the key electrode or the cancel electrode is formed from a copper-foil conductor of a printed wiring board, and the printed wiring board is placed beneath the top plate.

\* \* \* \* \*